(12) United States Patent
Kang et al.

(10) Patent No.: US 9,515,128 B2
(45) Date of Patent: Dec. 6, 2016

(54) DISPLAY DEVICE AND MANUFACTURING METHOD OF THE SAME

(71) Applicant: Samsung Display Co., Ltd., Yongin-Si, Gyeonggi-Do (KR)

(72) Inventors: Sung Ku Kang, Suwon-si (KR); Sang Wol Lee, Yongin-si (KR); Tae Hyeong Jung, Hwaseong-si (KR); Gyeong Ho Jeong, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/855,515

(22) Filed: Sep. 16, 2015

(65) Prior Publication Data

US 2016/0087013 A1    Mar. 24, 2016

(30) Foreign Application Priority Data

Sep. 22, 2014    (KR) .................. 10-2014-0126029

(51) Int. Cl.
*H01L 29/18* (2006.01)
*H01L 27/32* (2006.01)
*G06F 3/041* (2006.01)
*H01L 51/52* (2006.01)

(52) U.S. Cl.
CPC .......... *H01L 27/323* (2013.01); *G06F 3/0412* (2013.01); *H01L 51/5237* (2013.01); *H01L 27/3223* (2013.01); *H01L 27/3244* (2013.01); *H01L 51/5281* (2013.01); *H01L 2251/5338* (2013.01)

(58) Field of Classification Search
CPC .............................. H01L 27/323; H01L 51/56
See application file for complete search history.

(56) References Cited

U.S. PATENT DOCUMENTS

2007/0171326 A1* 7/2007 Taguchi ................ G06F 3/0436
349/63

FOREIGN PATENT DOCUMENTS

| JP | 2011-047976 A | 3/2011 |
|---|---|---|
| KR | 1020100027482 A | 3/2010 |
| KR | 1020110106539 A | 9/2011 |
| KR | 1020130004085 A | 1/2013 |
| KR | 1020130007311 A | 1/2013 |
| KR | 1020130104300 A | 9/2013 |

* cited by examiner

*Primary Examiner* — Ellias M Ullah
(74) *Attorney, Agent, or Firm* — Cantor Colburn LLP

(57) ABSTRACT

A display device includes: a supporting member including a body, and a supporter rotatably coupled to a side surface of the body; a display substrate on the supporting member, the display substrate including a first region, and a second region at an outer periphery of the first region; an emission layer on the first region and the second region of the display substrate; a polarizer on the emission layer and on the first region of the display substrate; a touch panel on the polarizer; and a window on the touch panel. The supporter is configured to support the second region of the display substrate such that the second region of the substrate is in a bent-state in a non-display region of the device.

8 Claims, 7 Drawing Sheets

DISPLAY DEVICE AND MANUFACTURING METHOD OF THE SAME

This application claims priority to Korean Patent Application No. 10-2014-0126029 filed on Sep. 22, 2014, and all the benefits accruing therefrom under 35 U.S.C. §119, the entire contents of which are incorporated herein by reference.

BACKGROUND (a) Field

The invention relates to a display device and a manufacturing method thereof.

(b) Description of the Related Art

Display devices include a liquid crystal display ("LCD"), a plasma display panel ("PDP"), an organic light emitting diode ("OLED") device, a field effect display ("FED"), an electrophoretic display device, and the like.

Particularly, the OLED display device includes two electrodes and an organic emission layer positioned therebetween, and an electron injected from one electrode and a hole injected from the other electrode are coupled with each other in the organic emission layer to generate an exciton, and the exciton emits energy to emit light.

Since the OLED device has a self-luminance characteristic and does not require a separate light source, unlike the LCD, thickness and weight thereof may be reduced. Further, since the OLED device has high-grade characteristics such as relatively low power consumption, high luminance and a high response speed, the OLED device receives attention as a next-generation display device.

SUMMARY

As compared to previous display devices, it is desirable for a display device to have a relatively wider display area and a relatively smaller bezel region serving as a non-display area other than the display area.

One or more exemplary embodiment of the invention provides a display device and a manufacturing method thereof, having advantages of accommodating a non-display area dummy emission layer disposed outside a display area emission layer such that a bezel region defined outside the display area is minimized.

An exemplary embodiment provides a display device including: a supporting member including: a body, and a supporter rotatably coupled to a side surface of the body; a display substrate on the supporting member, the display substrate including a first region, and a second region at an outer periphery of the first region; an emission layer on the first region and the second region of the display substrate; a polarizer on the emission layer and on the first region of the display substrate; a touch panel on the polarizer; and a window on the touch panel. The supporter is configured to support the second region of the display substrate such that the second region of the substrate is in a bent-state in a non-display region of the display device.

The bent state of the second region of the display substrate may dispose an end portion thereof facing upwardly.

The supporter may include a supporting surface which faces the bent-state second region of the display substrate and has a shape corresponding to a bent shape of the bent-state second region.

The supporter may be hingedly coupled to the body to be rotatable about the body.

The display device may further include a securing member configured to secure a position of the supporter with respect to the body such that the supporter supports the second region of the display substrate in the bent state.

The display device may further include a dummy film between the emission layer and the polarizer, on the first region and the second region of the display substrate.

The display substrate may be flexible.

The portion of emission layer on the second region of the display substrate may be a dummy emission layer in the non-display region of the display device.

Another exemplary embodiment provides a manufacturing method of a display device, including: rotatably coupling a supporter to a side surface of a body, to form a supporting member; preparing a display substrate including a first region, and a second region disposed at an outer periphery of the first region; disposing the display substrate on the supporting member; disposing the emission layer on the first region and on the second region of the display substrate; disposing a polarizer on the emission layer to correspond to the first region of the display substrate; disposing the touch panel on the polarizer; disposing a window on the touch panel; and rotating the supporter relative to the body to support the second region of the display substrate in a bent state such that an end portion of the second region of the display substrate faces upwardly in a non-display region of the display device.

The manufacturing method may further include securing a position of the supporter with respect to the body after the rotating the supporter.

The supporter may be hingedly coupled to the side surface of the body to be rotatably coupled to the body.

The supporter may include a supporting surface which faces the bent-state second region of the display substrate and has a shape corresponding to a bent shape of the bent-state second region.

The manufacturing method may further include disposing a dummy film on the first region and the second region of the display substrate, before the forming the polarizer on the emission layer.

A portion of the emission layer on the second region of the display substrate may be a dummy emission layer in the non-display area of the display device.

The display substrate may be flexible.

According to one or more exemplary embodiment, the width of a bezel region serving as a non-display area other than the display area may be minimized, by securing a dummy emission layer in a bended state in the non-display area.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
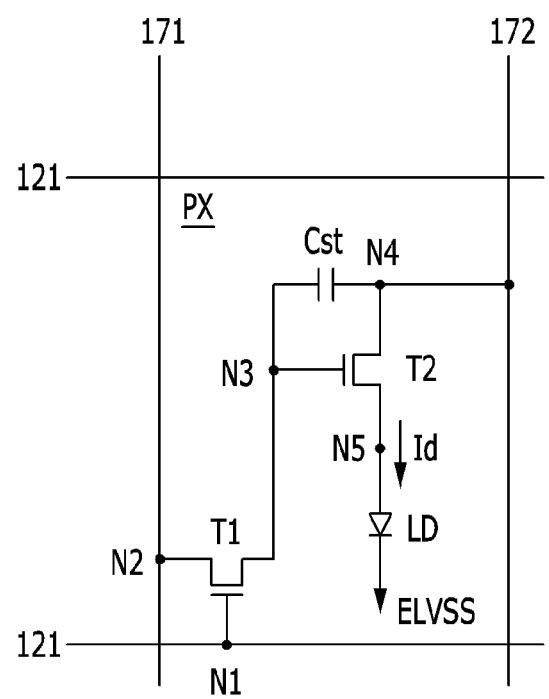
FIG. 1 is an equivalent circuit diagram illustrating an exemplary embodiment of one pixel of an organic light emitting diode device.

Hereinafter, exemplary embodiments of the invention will be described in detail with reference to the accompanying drawings. As those skilled in the art would realize, the described exemplary embodiments may be modified in various different ways, all without departing from the spirit or scope of the invention. On the contrary, exemplary embodiments introduced herein are provided to make disclosed contents thorough and complete and sufficiently transfer the spirit of the invention to those skilled in the art.

In the drawings, the thickness of layers, films, panels, regions, etc., are exaggerated for clarity. It will be understood that when a layer is referred to as being "on" another layer or substrate, it can be directly on the other layer or substrate, or intervening layers may also be present. Like reference numerals designate like elements throughout the specification.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 4:
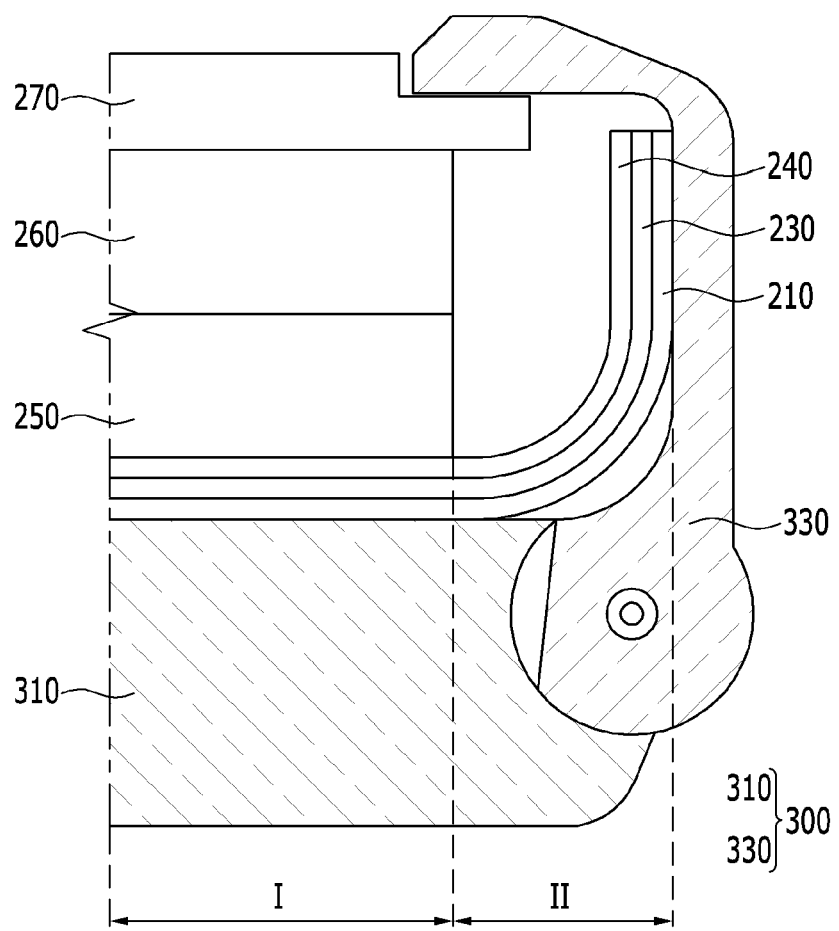
FIG. 4 is a cross-sectional view illustrating the display device taken along line IV-IV of FIG. 3.
Figure 5:
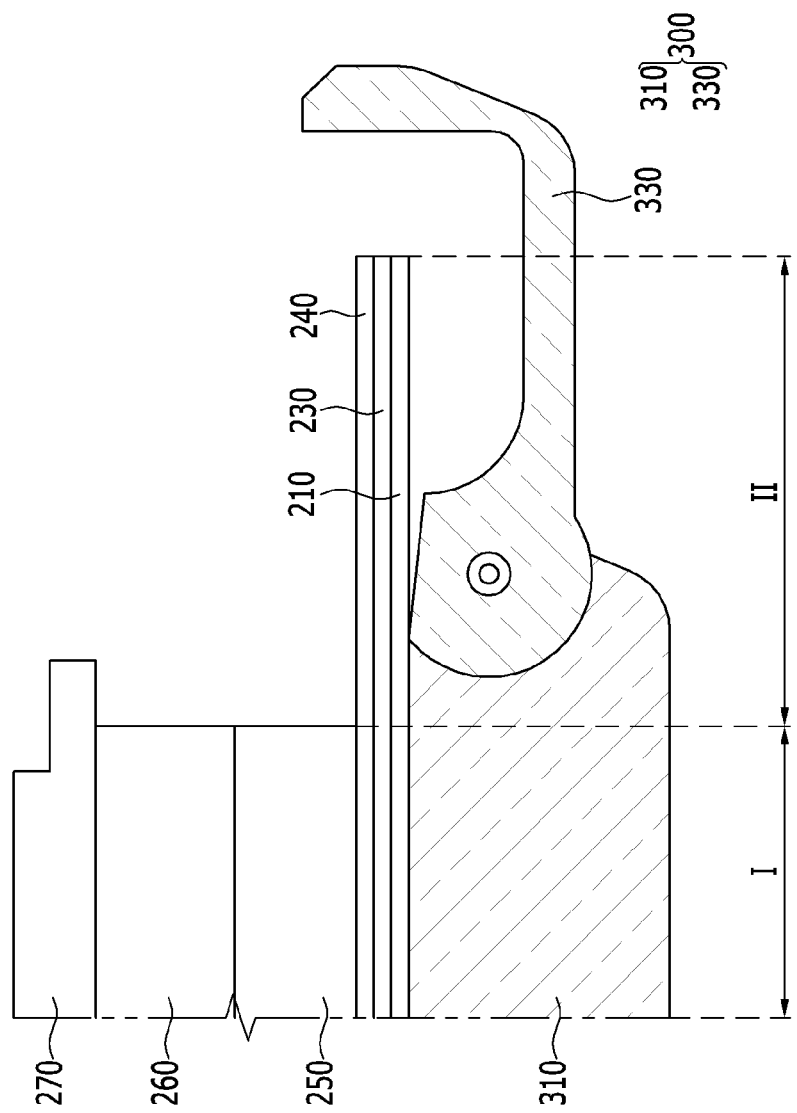
FIG. 5 is a cross-sectional view of an exemplary embodiment of the display device of FIG. 3 before being accommodated into an inside of a supporter.

Referring to FIG. 4 and FIG. 5, in an exemplary embodiment of a display device, a dummy emission layer portion at an outer region II of an emission layer 230 is secured in a bended state by a supporter 330 hingedly coupled to a body 310. The bent-state dummy emission layer portion can be easily secured and accommodated by the hinged supporter 330 in a display device bezel region serving as a non-display area other than the display area.

First, an exemplary embodiment of a display panel of a display device according to the invention will be described with reference to FIG. 1 and FIG. 2.

The display device described with reference to FIGS. 1 and 2 relates to an organic light emitting diode ("OLED") device.

However, exemplary embodiments of the display device according to the invention are not limited thereto, and a liquid crystal display ("LCD"), a plasma display panel ("PDP"), a field effect display ("FED"), an electrophoretic display device, and the like may be applied.

FIG. 1 is an equivalent circuit diagram illustrating an exemplary embodiment of one pixel of a display panel in an OLED device. FIG. 2 is a cross-sectional view illustrating an exemplary embodiment of a display panel in an OLED device.

Referring to FIG. 1, the OLED device includes a plurality of signal lines 121, 171 and 172, and a pixel PX connected thereto. The pixel PX may be one of a red pixel R, a green pixel G, and a blue pixel B.

The signal lines include a scanning signal line 121 transferring a gate signal (or scanning signal), a data line 171 transferring a data signal, and a driving voltage line 172 transferring a driving voltage.

A plurality of scanning signal lines 121 extends substantially in a row direction and is substantially parallel to each other, and a plurality of data lines 171 extends substantially in a column direction and is substantially parallel to each other. Referring to FIG. 1, a plurality of driving voltage lines 172 extends substantially in a column direction, but the invention is not limited thereto. A plurality of driving voltage lines 172 may extend in a row direction or a column direction, or extend in both row and column directions to form a net or lattice shape.

One pixel PX includes a thin film transistor including a switching transistor T1 and a driving transistor T2, a storage capacitor Cst and an organic light emitting element LD. Although not illustrated, one pixel PX may further include a thin film transistor and/or a capacitor in order to compensate an electrical current provided in the organic light emitting element LD.

The switching transistor T1 includes a control terminal N1, an input terminal N2 and an output terminal N3. The control terminal N1 is connected to the scanning signal line 121, the input terminal N2 is connected to the data line 171, and the output terminal N3 is connected to the driving transistor T2.

The switching transistor T1 transfers the data signal received from the data line 171 to the driving transistor T2 in response to the scanning signal received from the scanning signal line 121.

In addition, the driving transistor T2 includes a control terminal N3, an input terminal N4 and an output terminal N5. The control terminal N3 is connected to the switching transistor T1, the input terminal N4 is connected to the driving voltage line 172, and the output terminal N5 is connected to the organic light emitting element LD.

The driving transistor T2 allows an electrical output current Id of which amplitude varies according to a voltage applied between the control terminal N3 and the output terminal N5 to flow.

The storage capacitor Cst is connected between the control terminal N3 and the input terminal N4 of the driving transistor T2. The storage capacitor Cst charges the data signal applied to the control terminal N3 of the driving transistor T2, and maintains the charged data signal even after the switching transistor T1 is turned off.

The organic light emitting element LD, for example, in an OLED, includes an anode connected to the output terminal N5 of the driving transistor T2 and a cathode connected to a common voltage ELVSS. The organic light emitting element LD emits light by varying light intensities according to the output current Id of the driving transistor T2 to display an image.

The organic light emitting element LD may further include an organic material which uniquely expresses any one or more primary color such as three primary colors of red, green and blue. The OLED device displays a desired image by a spatial sum of the expressed colors.

The switching transistor T1 and the driving transistor T2 may both be n-channel field effect transistors ("FET"), but the invention is not limited thereto. In an exemplary embodiment, at least one of the switching transistor T1 and the driving transistor T2 may be a p-channel FET. Further, in an exemplary embodiment, a connection relationship of the transistors T1 and T2, the storage capacitor Cst and the organic light emitting element LD illustrated in FIG. 1 may be variously changed.

Hereinafter, an exemplary embodiment of an OLED device will be described with reference to a cross-sectional view illustrated in FIG. 2.

Figure 2:
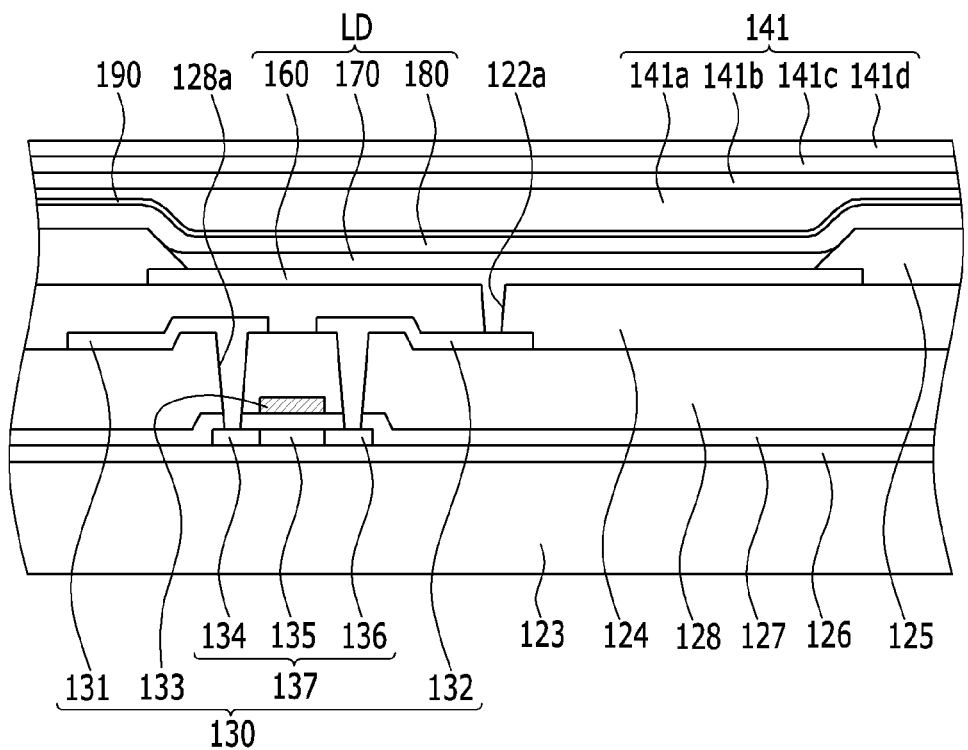
FIG. 2 is a cross-sectional view illustrating an exemplary embodiment of an organic light emitting diode device.

Referring to FIG. 2, a substrate 123 may form an insulating substrate and include of glass, quartz, ceramics, metal, plastic, or the like.

In addition, a substrate buffer layer 126 is disposed on the substrate 123. The substrate buffer layer 126 serves to reduce or effectively prevent penetration of impure elements to other features of the OLED device and to planarize the surface of the substrate 123.

The substrate buffer layer 126 may include various materials capable of performing the functions noted above. In an exemplary embodiment, for example, one of a silicon nitride (SiNx) layer, a silicon oxide (SiOx) layer, and a silicon oxynitride (SiOxNy) layer may be used as the substrate buffer layer 126. In an exemplary embodiment, the substrate buffer layer 126 may be omitted according to a type of substrate 123 and/or a process condition within a method of manufacturing the OLED device.

A driving semiconductor layer 137 is disposed on the substrate buffer layer 126. The driving semiconductor layer 137 includes a polysilicon layer. Further, the driving semiconductor layer 137 includes defined therein, a channel region 135 in which impurities are not doped, and a source region 134 and a drain region 136 in which impurities are doped at respective sides of the channel region 135. The doped ion materials may be P-type impurities such as boron (B), and $B_2H_6$. Herein, the impurities vary according to a type of thin film transistor disposed within the OLED device.

A gate insulating layer 127 including a silicon nitride (SiNx) or a silicon oxide (SiOx) is disposed on the driving semiconductor layer 137.

A gate wire including a driving gate electrode 133 is disposed on the gate insulating layer 127. In addition, the driving gate electrode 133 is disposed to overlap at least a part of the driving semiconductor layer 137, particularly, the channel region 135.

An interlayer insulating layer 128 covering the driving gate electrode 133 is disposed on the gate insulating layer 127. Contact holes 128a exposing the source region 134 and the drain region 136 of the driving semiconductor layer 137 are defined in the gate insulating layer 127 and the interlayer insulating layer 128.

The interlayer insulating layer 128 may include a ceramic-based material such as a silicon nitride (SiNx) or a silicon oxide (SiOx), such as including a same material as the gate insulating layer 127.

In addition, a data wire including a driving source electrode 131 and a driving drain electrode 132 is disposed on the interlayer insulating layer 128. Further, the driving source electrode 131 and the driving drain electrode 132 are connected with the source region 134 and the drain region 136 of the driving semiconductor layer 137 through the contact holes 128a defined in the interlayer insulating layer 128 and the gate insulating layer 127, respectively.

As such, a driving thin film transistor 130 including the driving semiconductor layer 137, the driving gate electrode 133, the driving source electrode 131, and the driving drain electrode 132 is formed. The configuration of the driving thin film transistor 130 is not limited to the aforementioned example, and may be variously modified as a known configuration which may be easily implemented by those skilled in the art.

In addition, a planarization layer 124 covering the data wire is disposed on the interlayer insulating layer 128. The planarization layer 124 serves to remove and planarize a step formed by underlying elements in order to increase emission efficiency of the organic light emitting element LD to be formed thereon. Further, an electrode via hole 122a is defined the planarization layer 124 to expose the driving drain electrode 132.

The planarization layer 124 may include one or more materials among a polyacrylate resin, an epoxy resin, a phenolic resin, a polyamide resin, a polyimide resin, an unsaturated polyester resin, a polyphenylene ether resin, a polyphenylene sulfide resin and benzocyclobutene ("BCB").

Here, the invention is not limited to the aforementioned exemplary embodiment structure, and in alternative exemplary embodiments, one of the planarization layer 124 and the interlayer insulating layer 128 may be omitted.

A first electrode of the organic light emitting element LD, that is, a pixel electrode 160, is disposed on the planarization layer 124. That is, the OLED device includes a plurality of pixel electrodes 160 which is disposed for a plurality of pixels, respectively. The pixel electrodes 160 are disposed separately from each other, such as being discrete elements which are spaced apart from each other in the top plan view of the OLED device. In the organic light emitting element LD, the pixel electrode 160 is connected to the driving drain electrode 132 through the electrode via hole 122*a* defined in the planarization layer 124.

Further, a pixel defining layer 125 in which is defined an opening exposing the pixel electrode 160, is disposed on the planarization layer 124. That is, within the OLED device, a plurality of openings is defined the pixel defining layer 125 to correspond to a plurality pixels, respectively.

An organic emission layer 170 may be disposed for each opening defined by portions of the pixel defining layer 125. Accordingly, a pixel area in which the organic emission layer is disposed may be defined by the pixel defining layer 125.

The pixel electrode 160 is disposed to correspond to the opening defined by portions of the pixel defining layer 125. The pixel electrode 160 may be disposed only in the opening to not overlap the pixel defining layer. However, the pixel electrode 160 is not necessarily disposed only in the opening of the pixel defining layer 125, but a portion thereof may be disposed below the pixel defining layer 125 so that a part of the pixel electrode 160 overlaps with the pixel defining layer 125 as illustrated in FIG. 2.

The pixel defining layer 125 may include resin such as a polyacrylate resin and polyimides, a silica-based inorganic material, or the like.

The organic emission layer 170 is disposed on the pixel electrode 160.

In addition, a second electrode, that is, a common electrode 180, may be disposed on the organic emission layer 170. As such, the organic light emitting element LD including the pixel electrode 160, the organic emission layer 170 and the common electrode 180 is formed.

Each of the pixel electrode 160 and the common electrode 180 may include a transparent conductive material or may include a transflective or reflective conductive material. According to a material forming the pixel electrode 160 and the common electrode 180, the OLED device may be a top emission type, a bottom emission type or a double-sided emission type.

An overcoat 190 configured to cover and protect the common electrode 180 may be disposed as an organic layer on the common electrode 180.

In addition, a thin film encapsulation layer 141 is disposed on the overcoat 190. The thin film encapsulation layer 141 encapsulates and protects the organic light emitting element LD and a driving circuit part disposed on the substrate 123 from elements outside the OLED device.

The thin film encapsulation layer 141 includes organic encapsulation layers 141*a* and 141*c* and inorganic encapsulation layers 141*b* and 141*d* which are alternately laminated. In FIG. 2, for example, an exemplary embodiment where two organic encapsulation layers 141*a* and 141*c* and two inorganic encapsulation layers 141*b* and 141*d* are alternately laminated to configure the thin film encapsulation layer 141 is illustrated, but the invention is not limited thereto.

Within the display panel, a combination of the aforementioned layers 123 through 124 and elements thereof may be generally referred to as a display substrate of the display panel. A combination of remaining layers 125 through the organic light emitting element LD in FIG. 2 may generally be referred to as an emission layer of the display panel.

An exemplary embodiment of a display device will be described hereinafter with reference to FIG. 3 to FIG. 5.

Referring to FIG. 4, a substrate 210 may include a first region I and a second region II, each region being defined in both a bended and an un-bended state of the substrate 210. Specifically, referring to FIG. 5, the first region I indicates a central region of the substrate 210, and the second region II indicates a region of the substrate 210 at an outer periphery of the first region I. The first region I may correspond to a display area of the display device, where the second region II may correspond to a non-display area of the display device. A dummy emission layer to be described later may be disposed at the second region II of the substrate 210.

The substrate 210 may be a flexible substrate. Accordingly, the second region II of the substrate 210 may be bent relative to an un-bended state in a supporter 330 to be described later. The bent-state region II may be disposed in the non-display region of the display device. As shown in FIG. 4, as the second region II of the substrate 210 is disposed bent, a width occupied by the second region II of the substrate 210 can be reduced as compared to the width in the un-bended state. As a result, the width of the OLED device bezel region serving as the non-display area other than the display area can be reduced.

The second region II of the substrate 210 may be bent to allow an end portion thereof to face upwardly toward a viewing side of the OLED device.

According to the exemplary embodiment, the second region II of the substrate 210 is supported by the supporter 330. As a result, as shown in FIG. 4, the substrate 210 secured by the supporter 330 to be disposed in a bent state such that an end portion thereof faces upwardly.

The supporter 330 is coupled to opposite side surfaces of the body 310. Specifically, the supporter 330 is movably coupled to the opposite side surfaces of the body 310 to be rotatable about an axis. In an exemplary embodiment, for example, the supporter 330 is hingedly coupled to the body 310 to be rotatable about a hinge axis.

As shown in FIG. 4, the supporter 330 is rotated with respect to the body 310 in a counterclockwise direction from an un-bended state thereof, to secure the second region II of the substrate 210 such that an end portion thereof faces upwardly. Accordingly, the bent-state width of the second region II of the substrate 210 that may correspond to the OLED device bezel region, may be reduced as compared to the un-bent state width of the second region II of the substrate 210.

Further, a supporting surface of the supporter 330 that is disposed to face the second region II of the substrate 210 may be disposed to correspond to a bent shape of the substrate 210. The supporting surface of the supporter 330 may be considered extended substantially parallel to a profile of the bent shape of the substrate 210. Accordingly, a stress that may be caused in the bent second region 210 of the substrate 210 may be reduced.

The body 310 and the supporter 330 constitute an exemplary embodiment of a supporting assembly 300 of the display device.

As a result, the supporting assembly 300 may be disposed to accommodate the substrate 210, the emission layer 230, a polarizer 250, a touch panel 260 and a window 270. The supporting assembly 300 is configured to accommodate the OLED device constituent elements therein to reduce ore effectively prevent damage or breakdown of the constituent elements.

Figure 3A:
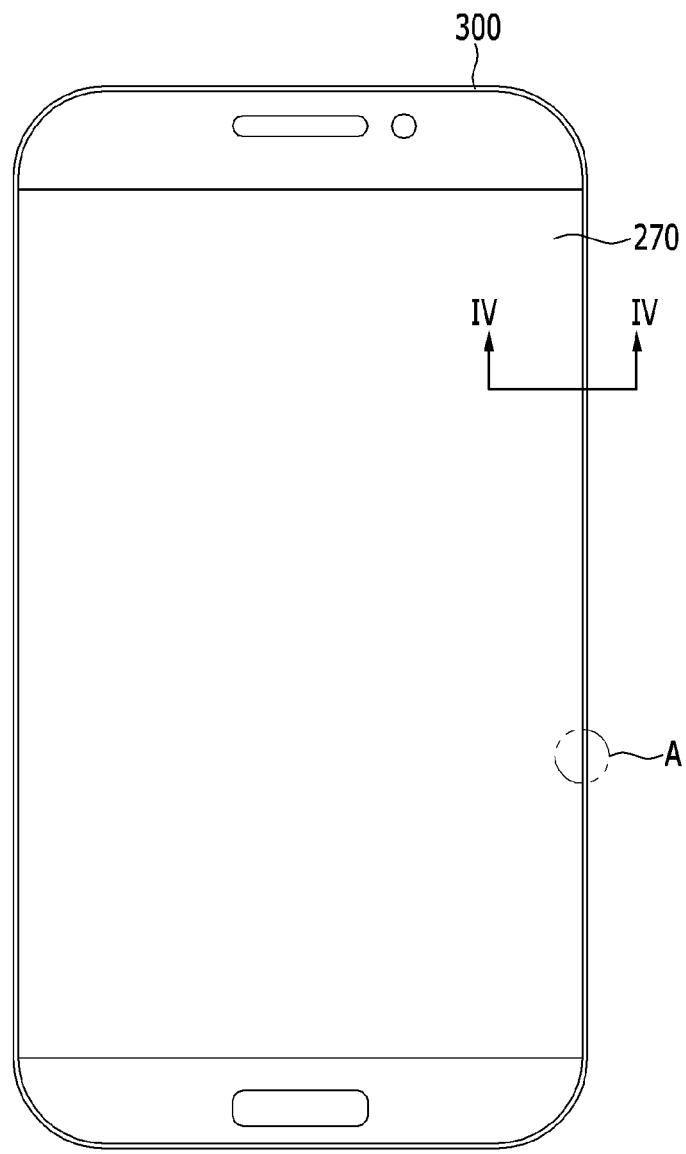
FIG. 3A is a top plan view illustrating an exemplary embodiment of a display device and FIG. 3B is an enlarged plan view of portion A of the display device of FIG. 3A.
Figure 3B:
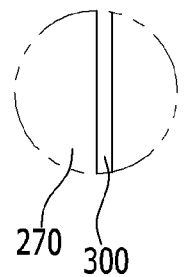

Referring to FIG. 3, the window 270 and a cross-sectional upper portion of the assembly 300 may be disposed to be adhered to each other.

The display device may further include a securing member (not shown) for securing the supporter 330 to the body 310. The securing member is disposed to secure the supporter 330 such that the supporter 330 is not rotatable with respect to the body 310.

In other words, the securing member facilitates securing a position of the supporter 330 with respect to the body 310 to maintain a bent state of the second region II of the substrate 210 supported by the supporter 330.

The emission layer 230 may be disposed on the substrate 210. The emission layer 230 may extend to be disposed on the first region I and the second region II of the substrate 210.

The emission layer 230 disposed on the first region I of the substrate 210 may be controlled to emit light by a thin film transistor (not shown) or the like. However, the emission layer 230 disposed on the second region II of the substrate 210 may be a dummy emission layer. The dummy emission layer portion of the emission layer 230 may be configured to not emit light. Where the first region I portion of the emission layer 230 may emit light, such portion may be disposed in a display area of the OLED device. In contrast, where the second region II dummy portion of the emission layer 230 may not emit light, such dummy portion may not support display of an image and therefore may be disposed in a non-display area of the OLED device.

As a result, the portion of the emission layer 230 disposed on the second region II of the substrate 210 may be configured to be bendable, similar to the substrate 210.

Herein, the emission layer 230 may include an organic light emitting element. Since a well-known structure may be applied to the structure of the emission layer 230, a detailed description thereof will be omitted. Referring to FIG. 2, a combination of the elements and layers including the substrate 123 through the thin film encapsulating layer 141 may be represented by the substrate 210 and the emission layer 230 illustrated in FIGS. 3-5. The feature indicated by 210 in FIGS. 3-5 may be otherwise referred to as a display substrate 210 including element layers illustrated in FIG. 2 that collectively define a display substrate.

In the exemplary embodiment, a dummy film 240 may be disposed on the emission layer 230. As shown in FIG. 4, the dummy film 240 may be disposed on the first region I and the second region II of the substrate 210.

The dummy film 240 serves to reduce or effectively prevent a compressive force or a tensile force from being generated in the emission layer 230. In other words, the dummy film 240 serves to dispose the emission layer 230 on a neutral plane.

If no dummy film 240 is disposed as described above, when the emission layer 230 is bent at the second region II, the compressive force or the tensile force may be applied to the emission layer 230. Accordingly, a crack or the like may be undesirably generated in the emission layer 230 so that the emission layer 230 may be damaged.

However, where the substrate 210, the emission layer 230 and the dummy film 240 are sequentially stacked at the second region II, the emission layer 230 may be disposed on the neutral plane so as to reduce or effectively prevent a compressive force or a tensile force from being generated in and damaging the emission layer 230.

In another exemplary embodiment of a display device, the dummy film 240 may be omitted.

The dummy film 240 may be attached on the emission layer 230 by using a pressure sensitive adhesive ("PSA") (not shown).

The polarizer 250 may be disposed on the dummy film 240. The polarizer 250 is disposed on the emission layer 230 and the dummy film 240 to correspond to the first region I of the substrate 210. The polarizer 250 may be excluded from the second region II.

As a result, the polarizer 250 is disposed above the first region I of the substrate 210 in the cross-sectional direction.

The polarizer 250 serves to change an optical axis of light emitted through the emission layer 230 and to the outside of the OLED device. In general, a polarizing plate has a structure in which a transparent protection film is deposited on both sides or on one side of a polarizer made of a polyvinyl alcohol-based resin, but the invention is not limited thereto.

In detail, the polarizing plate 250 has a structure in which polyvinyl alcohol ("PVA")-based molecule chains are arranged in a predetermined direction, and a triacetyl cellulose ("TAC") film as the protection film is adhered to the polarizer including an iodine-based compound or a dichroic polarizer material. The polarizer and the protection film may be adhered by an aqueous adhesive made of a polyvinyl alcohol-based solution.

However, the polarizing plate 250 is not limited thereto, and a polarizing plate of various structures may be used.

The touch panel 260 may be disposed at an upper portion of the polarizer 250 in the cross-sectional direction. The touch panel 260 may sense an external touch input to the OLED device. Similar to the polarizer 250, the touch panel 260 is disposed above the first region I of the substrate 210, and may be excluded from the second region II.

A capacitive type of touch panel may be applied as the touch panel 260. However, the touch panel 260 is not limited thereto. Alternatively, the touch panel 260 may be a resistive type of touch panel or an electro-magnetic type of touch panel.

The window 270 may be disposed above the touch panel 260, at the viewing side of the OLED deice. The window 270 serves to protect the touch panel 260, the polarizer 250, the emission layer 230, and the like which are disposed below the window 270 in the cross-sectional view.

As shown in FIG. 4, a width of the window 270 may be wider than that of the first region I of the substrate 210. The portion of the window 270 extended further than the first region I may engage with the supporter 330 of the supporting assembly 300.

Hereinafter, an exemplary embodiment of a manufacturing method of a display device will be described with reference to FIG. 5 and FIG. 6. In describing the manufacturing method of the display device, detailed descriptions of same elements in the figures will be omitted.

Figure 6:
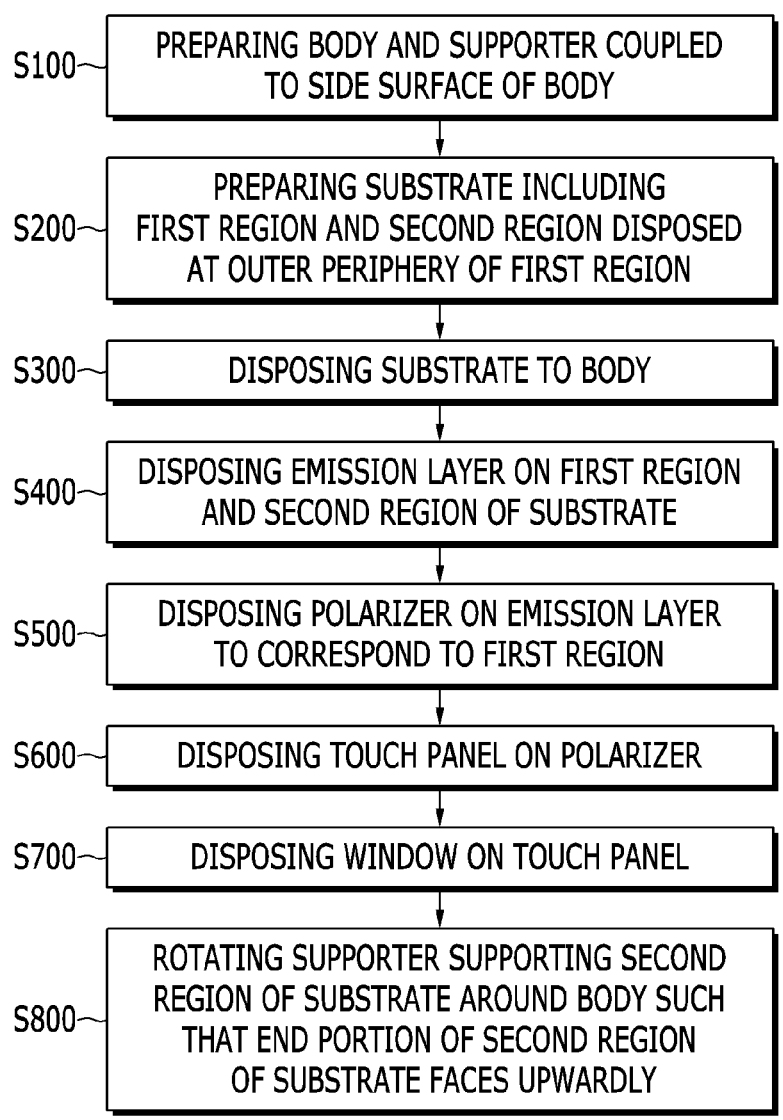
FIG. 6 is a flowchart illustrating an exemplary embodiment of a manufacturing method of a display device.

Referring to FIG. 6, in accordance with the exemplary embodiment of the manufacturing method of the display device, the body 310, and the supporter 330 that is coupled to a side surface of the body 310, are disposed (e.g., prepared) (S100).

The substrate 210 is prepared (S200). The substrate 210 may include a first region I and a second region II. The first region I indicates a central region of the substrate 210, and the second region II indicates a region defined at an outer periphery of the first region I.

The dummy emission layer 230 is disposed on the second region II of the substrate 210, and the second region II is bent such that an end portion thereof faces upwardly. That is, the substrate 210 may be flexible.

The substrate 210 is disposed on the body 310 (S300).

The emission layer 230 is formed (e.g., provided) on the first region I and the second region II of the substrate 210 (S400). The emission layer 230 formed on the first region I of the substrate 210 may be controlled by a thin film transistor (not shown) and the like to emit light. However, the emission layer 230 formed on the second region II of the substrate 210 may not emit light to define a dummy emission layer portion of the emission layer 230.

The polarizer 250 is formed on the emission layer 230 (S500). The polarizer 250 is disposed above the first region I of the substrate 210.

The dummy film 240 may be formed on the emission layer 230 after the polarizer 250 is formed on the emission layer 230, however, the invention is not limited thereto. In an exemplary embodiment, the dummy film 240 may be formed on the emission layer 230 before the polarizer 250 is formed on the emission layer 230. As described above, the dummy film 240 may serve to reduce or effectively prevent a compressive force or a tensile force from being generated in the emission layer 230 that is bent at the second region II. In other words, the dummy film 240 serves to dispose the emission layer 230 to a neutral plane.

The touch panel 260 is formed on the polarizer 250 (S600). The touch panel 260 may sense an external touch input to the OLED device. Similar to the polarizer 250, the touch panel 260 is disposed above the first region I of the substrate 210.

The window 270 is disposed on the touch panel 260 (S700). The window 270 is configured to protect the touch panel 260, the polarizer 250, the emission layer 230, and the like which are disposed below the window 270.

The supporter 330 supporting the second region II of the substrate 210 is rotated about the body 310 such that an end portion of the second region II of the substrate 210 faces upwardly toward a viewing side of the OLED device (S800).

Referring to FIG. 5, the second region II of the substrate 210 is disposed to face upwardly by rotating the supporter 330 supporting the second region II of the substrate 210 about the body 310 in a counterclockwise direction from an un-bended state of the substrate 210.

A position of the supporter 330 is secured with respect to the body 310 such that the supporter 330 does not rotate about the body 310. A securing member (not shown) serves to secure the supporter 330 to the body 310 and to fix the rotated position of the supporter 330.

In accordance with one or more exemplary embodiment of a display device and a manufacturing method thereof, a dummy emission layer is provided to minimize a bezel region disposed at an outer periphery of a display area.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A display device comprising:
   a supporting member comprising:
      a body; and
      a supporter rotatably coupled to a side surface of the body;
   a display substrate on the supporting member, the display substrate comprising a first region, and a second region disposed at an outer periphery of the first region;
   an emission layer on the first region and the second region of the display substrate;
   a polarizer on the emission layer and on the display substrate first region;
   a touch panel on the polarizer;
   a window on the touch panel;
   wherein the supporter is configured to support the second region of the display substrate such that the second region of the substrate is in a bent-state in a non-display region of the display device.

2. The display device of claim 1, wherein the bent state of the second region of the display substrate disposes an end portion thereof facing upwardly.

3. The display device of claim 2, wherein the supporter comprises a supporting surface which faces the bent-state second region of the display substrate and has a shape corresponding to a bent shape of the bent-state second region.

4. The display device of claim 1, wherein the supporter is hingedly coupled to the side surface of the body to be rotatable about the body.

5. The display device of claim 4, further comprising
   a securing member configured to secure a position of the supporter with respect to the body such that the supporter supports the second region of the display substrate in the bent state.

6. The display device of claim 1, further comprising
   a dummy film between the emission layer and the polarizer, disposed on the first region and the second region of the display substrate.

7. The display device of claim 1, wherein the display substrate is flexible.

8. The display device of claim 1, wherein a portion of the emission layer on the second region of the display substrate is a dummy emission layer in the non-display region of the display device.

* * * * *

UNITED STATES PATENT AND TRADEMARK OFFICE
CERTIFICATE OF CORRECTION

| | | |
|---|---|---|
| PATENT NO. | : 9,515,128 B2 | |
| APPLICATION NO. | : 14/855515 | |
| DATED | : December 6, 2016 | |
| INVENTOR(S) | : Sung Ku Kang et al. | |

It is certified that error appears in the above-identified patent and that said Letters Patent is hereby corrected as shown below:

On the Title Page

(72) Inventors: Please correct the spelling of the third inventor's name as follows:

Tae Hyeog Jung, Hwaseong-si (KR)

Signed and Sealed this
Twenty-third Day of May, 2017

Michelle K. Lee
*Director of the United States Patent and Trademark Office*